United States Patent
Micheloni et al.

(10) Patent No.: US 6,433,583 B1
(45) Date of Patent: Aug. 13, 2002

(54) CMOS SWITCH CIRCUIT FOR TRANSFERRING HIGH VOLTAGES, IN PARTICULAR FOR LINE DECODING IN NONVOLATILE MEMORIES, WITH REDUCED CONSUMPTION DURING SWITCHING

(75) Inventors: Rino Micheloni, Turate; Giovanni Campardo, Bergamo, both of (IT); Atsushi Ohba, Tokyo (JP); Marcello Carrera, Trescore (IT)

(73) Assignees: STMicroelectronics S.r.l., Agrate Brianza (IT); Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 09/585,916

(22) Filed: Jun. 2, 2000

(30) Foreign Application Priority Data

Jun. 4, 1999 (EP) .......................... 99830345

(51) Int. Cl.[7] ........................................ H03K 19/0175
(52) U.S. Cl. .............................. 326/80; 326/81; 326/68
(58) Field of Search .............................. 326/80, 81, 68, 326/83

(56) References Cited

U.S. PATENT DOCUMENTS

| 4,656,373 A | * | 4/1987 | Plus ........................... 307/475 |
| 5,422,523 A | * | 6/1995 | Roberts et al. ............... 326/68 |
| 5,774,390 A | | 6/1998 | Tailliet ....................... 364/807 |
| 5,825,205 A | | 10/1998 | Ohtsuka ...................... 326/81 |
| 5,828,231 A | | 10/1998 | Bazargan ..................... 326/81 |
| 5,864,244 A | | 1/1999 | Kaplinsky .................... 326/58 |
| 5,889,415 A | * | 3/1999 | Parkinson .................... 326/68 |
| 6,114,875 A | * | 9/2000 | Gerber et al. ................. 326/80 |

FOREIGN PATENT DOCUMENTS

| EP | 0 809 254 A1 | 11/1997 |
| EP | 0 903 750 A1 | 3/1999 |

* cited by examiner

*Primary Examiner*—Michael Tokar
*Assistant Examiner*—Anh Tran
(74) *Attorney, Agent, or Firm*—Lisa K. Jorgenson; George C. Rondeau, Jr.; Seed IP Law Group, PLLC

(57) ABSTRACT

The switch circuit receives a first supply voltage and a second supply voltage different from each other; a control input receiving a control signal that may be switched between the first supply voltage and ground; a driving inverter stage supplied by the second supply voltage and defining the output of the circuit; a feedback inverter stage supplied by the second supply voltage and including a top transistor and a bottom transistor defining an intermediate node and having respective control terminals. The control terminal of the top transistor is connected to the output node, the control terminal of the bottom transistor is connected to the control input, and the intermediate node is connected to the input of the driving inverter stage. An activation element helps switching of the intermediate node from the second supply voltage to ground; current limiting transistors are arranged in the inverter stages to limit the current flowing during switching and to reduce the consumption of the circuit.

15 Claims, 4 Drawing Sheets

CMOS SWITCH CIRCUIT FOR TRANSFERRING HIGH VOLTAGES, IN PARTICULAR FOR LINE DECODING IN NONVOLATILE MEMORIES, WITH REDUCED CONSUMPTION DURING SWITCHING

TECHNICAL FIELD

The present invention regards a CMOS switch circuit for transferring high voltages. In particular, the present invention refers to the final stage of the row or column decoder of a nonvolatile memory wherein cells are read at a higher voltage than the supply voltage (boosted read voltage).

BACKGROUND OF THE INVENTION

As is known, the need to have available nonvolatile memories with increasingly higher densities leads to the use of multilevel memories, where the information, stored in floating-gate regions of the cells, is coded through a number of logic levels, thus fractionating the quantity of charge stored in each cell.

FIG. 1 shows the characteristic that links the gate-to-source voltage Vgs to the drain-to-source current Ids of a flash cell for a two-level memory, i.e., wherein information is coded in each memory cell via a bit having two possible values, associated, respectively to an on condition of the cell and to an off condition of the cell, which in turn depends upon a programmed or not programmed state of the cell. In particular, in FIG. 1, Vtv and Vtw represent the value of the gate-to-source voltage Vgs at which a flash cell starts conducting current, in the case of a virgin (erased) cell and of a written cell, respectively. In a memory of this type, logic value "1" is generally associated to the characteristic having threshold voltage Vtv normally comprised between 0.5 and 2.5 V, and the logic value "0" is associated to the characteristic having threshold voltage Vtw generally higher than 5 V.

It is moreover known that reading a memory cell comprises converting the current absorbed by the memory cell, at a given gate-to-source voltage Vgs, into a voltage which is then translated to an output CMOS level.

In case of multilevel cells, the plane (Vgs, Ids) is divided by a number of characteristics (as shown, for example, in FIG. 2, which regards storing two bits per cell) corresponding to four logic values "11", "10", "01", and "00". In this case, the four logic values correspond to four different threshold values Vt1, Vt2, Vt3, and Vt4, which in turn are linked to different quantities of charge stored in the floating gate regions of the memory cells.

Cell programming is affected by uncertainty, and the characteristics both of FIG. 1 and of FIG. 2 represent the central values of the actually obtainable distributions. In practice, each threshold value is associated to a respective distribution of values comprised between a minimum value and a maximum value set apart from the maximum value of the previous distribution and/or from the minimum value of the subsequent distribution in a way sufficient for enabling correct reading of the cells. In addition, each distribution may present a different amplitude, as shown, for example, in FIG. 3, which shows the distributions associated to memory cells, each storing two bits, and in which the scale is not uniform.

Also in this case, reading comprises converting the current flowing in a cell into a voltage. The thus obtained voltage is then compared with different voltage values that are intermediate between the threshold distributions referred to above.

One of the problems that arise when reading multilevel cells is linked to the read voltage applied to the gate terminals of the cells to be read. In fact, at the selected read voltage, all the read cells (with the possible exception of the cells programmed at the highest threshold value) must be on, so as to allow the converted voltage to be compared with the different voltage levels. Consequently, the read voltage must be at least higher than the last threshold voltage but one (Vt3 in FIG. 2; VR in FIG. 3, here 6 V).

Such a high read voltage is particularly problematic to handle in devices that have a single supply voltage $V_{CC}$, the nominal value of which is typically 3 V. In fact, high voltages are generated inside the nonvolatile memory by means of particular devices referred to as boosters or charge pumps. The Thevenin equivalent circuit of a charge pump 10 usable for this purpose is shown in FIG. 4 and comprises an ideal voltage source 11 generating a voltage $V_1$ and an equivalent resistor 12 connected in series to the ideal voltage source 11. The equivalent resistor 12 is further connected to a load 13 represented as a current source. FIG. 5 shows the output characteristic of the charge pump 10. As may be noted, the output voltage $V_0$ of the charge pump 10 is maximum when load 13 does not absorb current, and reduces linearly as the current absorbed by the load 13 increases.

In particular, from FIG. 5 it may be deduced that, when an output voltage not lower than $V_p$ is desired, the load 13 cannot absorb a current higher than $I_{pmax}$. Usually, charge pumps integrated in CMOS technology manage to supply currents smaller than 1 mA. Word lines being read require 6 V, with a maximum ripple of 50 mV. For this reason, the output of the charge pump is connected to a voltage regulator which, being supplied by the voltage of the charge pump 10, is able to yield a constant voltage of adequate value. It is evident that, in order to maintain the 6 V read voltage on the gate terminal of the cell to be read with adequate precision, it is necessary to consume as little current as possible during cell addressing.

The cell addressing phase, which determines switching of the row driving circuit, supplied at a 6-V read voltage, however, creates some problems. In fact, the switching control signals have a high logic level equal to the supply voltage, which, in the worst case, may be 2.5 V, so that there exists the problem of getting voltages with very different values to coexist in one and the same driving circuit, as will be explained in detail hereinafter.

The row decoder may be schematically represented by a number of inverters (one per row) controlled by a combinational circuit receiving the input addresses and having the function of driving the inverters in such a way that, each time, only one of them will have a high output. In particular, this combinational circuit sends a low logic signal to the inverter connected to the selected row (so that it will present a high output) and a high logic signal to all the other inverters. In this regard, see FIG. 6, showing one of the driving inverters 21, comprising a pull-up PMOS transistor 22 and a pull-down NMOS transistor 23, having coupled gate terminals (input node 24), coupled drain terminals (output node 25), and source terminals connected, respectively, to a first supply line 26 set at $V_{PP}$ and to a ground line.

The described simplified scheme works correctly when $V_{PP}=V_{CC}$, but does not work in the case described above, when the read voltage $V_{PP}$ is generated by a charge pump. In fact, in the latter case, the combinational circuit supplies, as a high logic level on input node 24 of the inverters of the non-selected rows, the read voltage $V_{CC}$, whilst the first supply line 26 is set at the voltage $V_{PP}>V_{CC}$. In this situation, between the gate and the source terminals of the pull-up transistors 22 of the driving inverters 21 of the non-selected rows, there is a non-zero voltage drop. If this voltage reaches the value of the threshold voltage of the transistors 22, the latter switches on, and the output node 25 of the inverters does not succeed in reaching a zero voltage value, as, instead, would be necessary to guarantee correctness of reading.

To solve the above problem, a first solution, shown in FIG. 7, involves the use of a positive feedback inverter using a feedback transistor 27 of PMOS type, connected between a first supply line 26 and the input node 24 of the driving inverter 21, and having a gate terminal connected to the output node 25. FIG. 7 moreover shows a NAND gate 30 belonging to the row selection combinational circuit and supplied at the read voltage $V_{CC}$ via a second supply line 31.

In this case, when the voltage on the output node 25 decreases, the feedback transistor 27 switches on and couples the input node 24 to voltage $V_{PP}$ on the first supply line 26, guaranteeing complete switching off of the pull-up transistor 22 and zeroing of the output voltage.

Also this solution is, however, not free from drawbacks, the main one of which being represented by the fact that the source-bulk junction of the PMOS transistors of the NAND gate 30 is directly biased and may give rise to current losses, given that these transistors have the source region biased at $V_{CC}$ and the drain region (connected to the output) and the bulk region biased at $V_{PP}$. To solve the above problem, it is possible to insert an NMOS-type pass transistor or a CMOS pass switch for separating the low-voltage part (predecoding) from the high-voltage part (decoding).

This solution is shown in FIG. 8, wherein the NAND gate 30 drives the driving inverter 21 through an NMOS pass transistor 32 having the gate terminal biased at $V_{CC}$.

In the solution of FIG. 8, when the output of the NAND gate 30 is high ($V_{CC}$), the pass transistor 32 operates as a diode, since it has two terminals (gate terminal and terminal connected to the output of the NAND gate 30) set at the same voltage; consequently, it generates a voltage drop between the output of the NAND gate 30 and the node 24 which is equal to its own threshold voltage.

As a consequence, also the solution illustrated in FIG. 8, besides entailing further circuit complications, is not optimal in the case of low supply voltage in that, in this condition, the voltage drop on the pass transistor 32 is such as not to enable the node 24 to reach the high voltage necessary for switching off completely the pull-up transistors 22, and thus the levels of consumption are high.

On the other hand, the use of a CMOS pass only shifts the problem of undesiredly biasing other parts of the circuit, besides entailing an unacceptable encumbrance for the decoding, made in the pitch of the array row.

In addition, the circuit of FIG. 8 has a high current consumption during switching, which is particularly burdensome for read voltages $V_{PP}$ of the order of 6 V, which are required for reading multilevel cells, as discussed above, and is slow during switching, which further aggravates the problem of consumption referred to above.

SUMMARY OF THE INVENTION

The aim of the present invention is therefore to provide a switch circuit that is able to transfer a high voltage to a load or circuit downstream, with reduced consumption during switching, in the presence of an input signal at a lower voltage.

According to the present invention, a switch circuit is provided, as defined in claim 1.

In practice, the switch circuit comprises a first inverter stage and a second inverter stage (feedback branch and driving branch, respectively) connected to the boosted supply line. The first inverter stage (feedback branch) has the top transistor (first main PMOS transistor) feedback-controlled, and the bottom transistor) controlled by the input signal, while the second inverter stage is controlled by the first inverter via an intermediate node. A first switching (from a deselected state to a selected state of the output) is activated directly by the input signal, while a second switching (from the selected state to the deselected state of the output) is activated via an activation element which raises the intermediate node or lowers the output. In this way, no components have two different terminals receiving the two supply voltages $V_{CC}$ and $V_{PP}$, and thus the problems presented by known circuits are solved.

BRIEF DESCRIPTION OF THE DRAWINGS

For the understanding of the present invention, a preferred embodiment thereof will now be described, simply to provide a non-limiting example, with reference to the attached drawings, wherein.

DETAILED DESCRIPTION OF THE INVENTION

Figure 1:
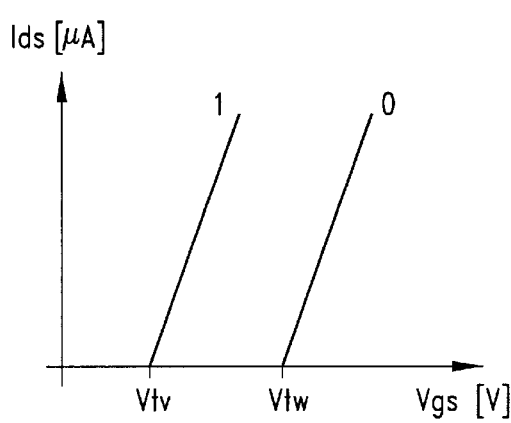
FIG. 1 shows the current-voltage characteristics used for storing one bit per memory cell.
Figure 2:
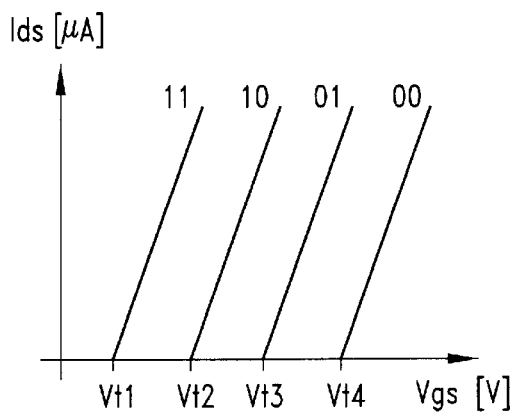
FIG. 2 shows the current-voltage characteristics used for storing two bits per memory cell.
Figure 3:
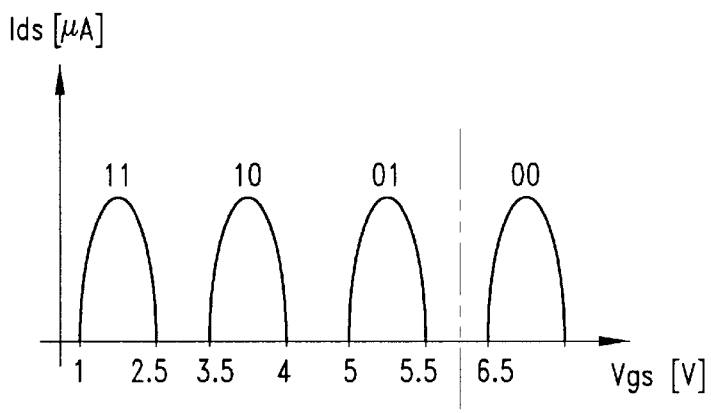
FIG. 3 presents the distribution of the effective threshold voltages when storing two bits per cell.
Figure 4:
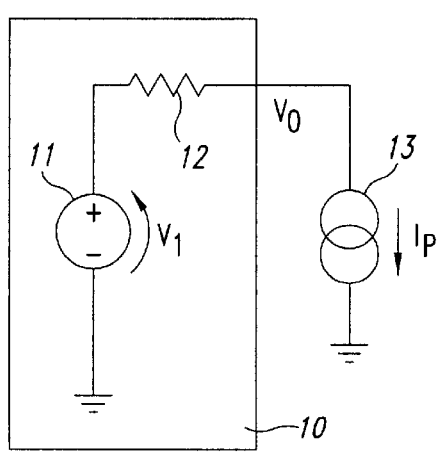
FIG. 4 shows an equivalent circuit of a charge-pump circuit used in nonvolatile memories.
Figure 5:
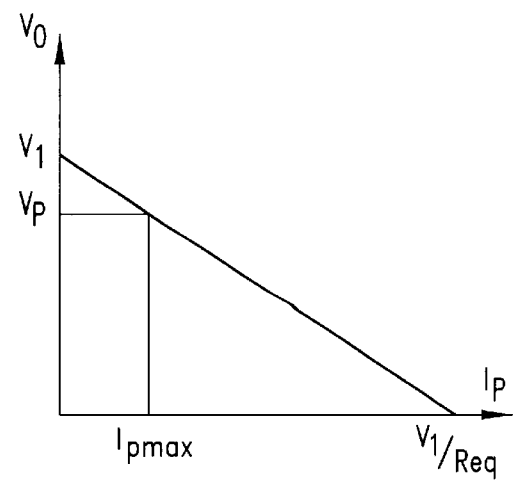
FIG. 5 shows the output characteristic of the charge-pump circuit of FIG. 4.
Figure 6:
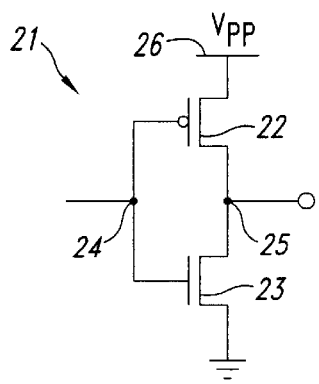
FIG. 6 shows the schematic circuit diagram of one part of a decoding circuit of a known type.
Figure 7:
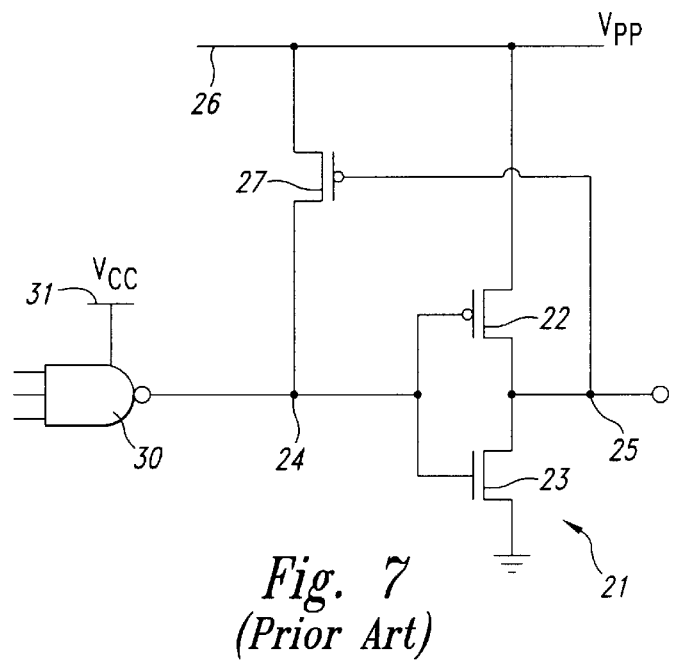
FIG. 7 presents the simplified diagram of a different decoding circuit of a known type.
Figure 8:
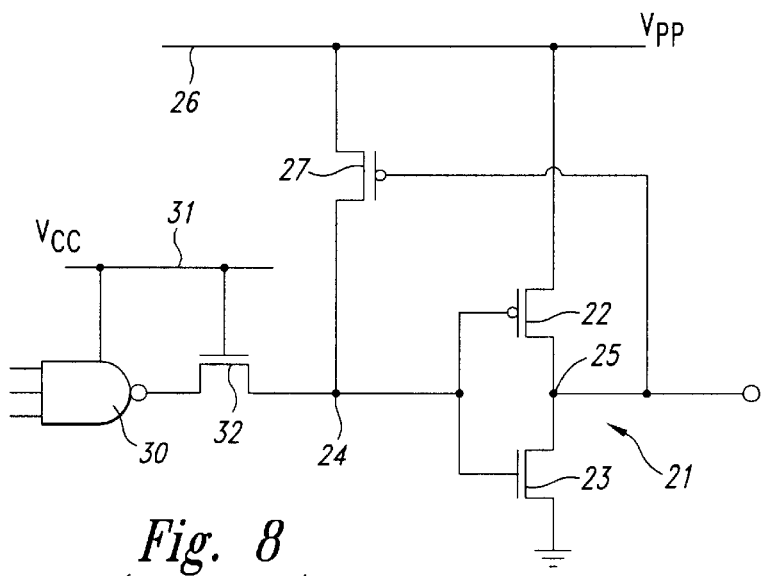
FIG. 8 presents a simplified diagram of a further decoding circuit of a known type.
Figure 9:
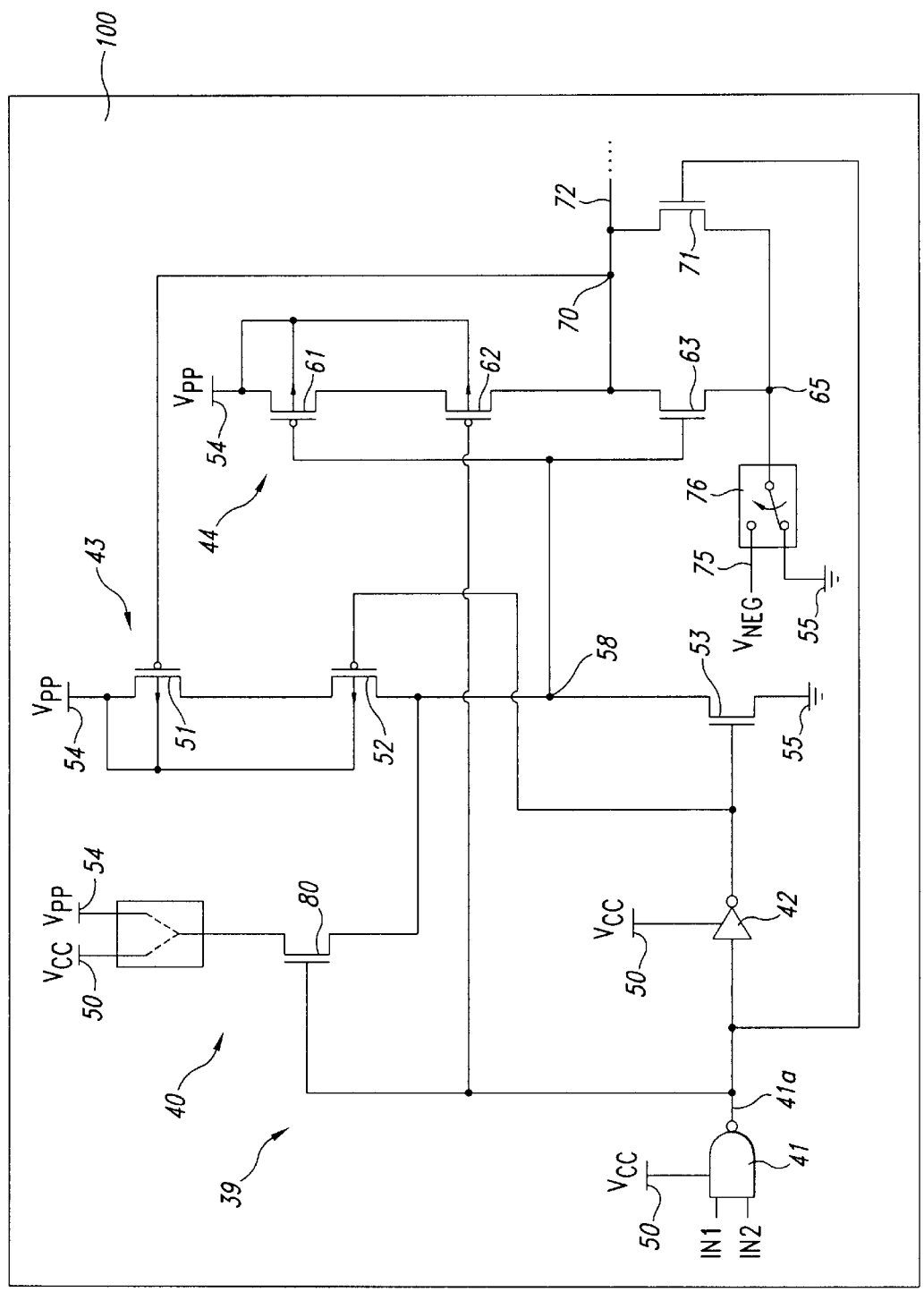
FIG. 9 shows a first embodiment of the switch circuit according to the invention.

In FIG. 9, switch circuit 40 is used inside a row decoder 39 belonging to a memory 100, in particular a nonvolatile memory with multilevel storage, referred to previously.

In general, the switch circuit 40 may be used to connect the output to one of two reference-potential lines according to a two-logic-level input signal (or preset combination of signals). Specifically, the switch circuit 40 is operative when the potential of at least one of the two input logic levels is not equal to that of the corresponding reference potential line, in particular when the potential corresponding to the high level of the output is much higher than the potential corresponding to the high level of the input signal (for example, it is 6 V as against 2.5 V of the input signal, as in the multilevel memories referred to above).

In FIG. 9, the switch circuit 40 is connected to a two-input NAND gate 41 receiving control signals IN1 and IN2 and belonging to previous decoding stages (not shown). The NAND gate 41 has an output 41a connected, via an inverter 42, to a feedback inverter stage 43 and to a driving inverter stage 44, each comprising three MOS transistors. Both the NAND gate 41 and the inverter 42 are connected to a first supply line 50 set at $V_{CC}$.

The output 41a of the NAND gate 41 and the output of the inverter 42 define control inputs of the switch circuit 40 respectively receiving the control signal and the inverted control signal.

The feedback inverter stage 43 comprises a first main PMOS transistor 51, a first auxiliary PMOS transistor 52, and a first NMOS transistor 53 connected together in series between a second supply line 54 (set at a voltage $V_{PP}$ greater than $V_{CC}$) and ground, indicated by 55.

In detail, the first NMOS transistor 53 of the feedback inverter stage has the gate terminal connected to the output of the inverter 42, the source terminal connected to ground 55, and the drain terminal connected to an intermediate node 58. The first auxiliary PMOS transistor 52 has the gate terminal connected to the output of the inverter 42, the drain terminal connected to the intermediate node 58, and the source terminal connected to the drain terminal of the first main PMOS transistor 51. The first main PMOS transistor 51 has the source terminal connected to the second supply line 54 and the gate terminal connected to an output node 70 of the switch circuit 40. Both the PMOS transistors 51, 52 have their bulk regions connected to the second supply line 54.

The driving inverter stage 44 comprises a second main PMOS transistor 61, a second auxiliary transistor 62, and a second NMOS transistor 63 connected together in series between the second supply line 54 and a reference line 65.

In detail, the second NMOS transistor 63 of the driving inverter stage 44 has the gate terminal connected to the intermediate node 58, the source terminal connected to a low level node 65, and the drain terminal connected to the output node 70. The second auxiliary PMOS transistor 62 has the gate terminal connected to the control input 41a, the drain terminal connected to the output node 70, and the source terminal connected to the drain terminal of the second main PMOS transistor 61. The second main PMOS transistor 61 has the gate terminal connected to the intermediate node 58 and the source terminal connected to the second supply line 54.

The output node 70 is connected to a word line 72 connected to a number of memory cells (not shown) belonging to the memory 100.

An output NMOS transistor 71 is coupled between the output node 70 and the low level node 65, and has the gate terminal connected to the control input 41a. The low level node 65 is normally connected to ground 55. If the memory 100 provides for erasing the memory cells (not shown) via the gate terminal, the low level node 65 is connected to a negative supply line 75, set at voltage $V_{NEG}$, as represented in FIG. 9 by a two position switch 76. In this case, moreover, the second NMOS transistor 63 and the output NMOS transistor 71 have their bulk regions connected to the source regions and are formed in a triple well.

A push NMOS transistor 80 has the source terminal connected to the intermediate node 58, the gate terminal connected to the control input 41a, and the drain terminal connected to the first supply line 50 or to the second supply line 54, as represented schematically in FIG. 9 by the dashed line and explained in detail hereinafter.

In the switch circuit 40 of FIG. 9 the dimensions of the second main PMOS transistor 61 are set according to the current required by the word line 72, taking into account that the corresponding auxiliary PMOS transistor 62 reduces the total current capability. Consequently, the dimensions of the second main PMOS transistor 61 are quite large, larger than those of the first main PMOS transistor 51, which does not have a function of driving the load (word line 72). The main PMOS transistors 51 and 61 are of dimensions larger than or equal to those of the corresponding auxiliary PMOS transistors 52 and 62, which have only the function of modulating the current capability and the stability of the respective inverter stages 43, 44, as explained in detail hereinafter. In addition, the push transistor 80 has small dimensions, since it must only facilitate raising of the intermediate node 58 during switching to the deselected state, while the output transistor 71 is of larger dimensions, since it must contribute to the voltage reduction of the word line 72 in the same switching to the deselected state, as described below. For example, the PMOS transistors 51, 52 have dimensions (W/L dimensional ratio) of 4 squares; the PMOS transistors 61, 62 have dimensions of 20 squares; the NMOS transistors 53, 63 have dimensions of 15 squares; the output transistor 71 has dimensions of 30 squares; and the push transistor 80 has dimensions of 15 squares.

The operation of the circuit of FIG. 9 will now be described assuming that the push transistor 80 is connected to the first supply line 50 and the low level node 65 is connected to ground. The input signals IN1 and IN2 represent signals coming from a predecoding circuit (not shown) and address the word line 72 when they are both at high logic level (at the supply voltage $V_{CC}$).

In the non-selected condition of the word line 72, at least one of the two input signals IN1 and IN2 is low; consequently, the output 41a of the NAND gate 41 is high (at $V_{CC}$), and the output of the inverter 42 is low (at ground). In this condition, the first NMOS transistor 53 of the feedback inverter stage 43 is off, the first PMOS transistors 51, 52 are on (as will emerge more clearly hereinafter), and the intermediate node 58 is high (at the voltage $V_{PP}$). Consequently, the first NMOS transistor 63 of the driving inverter stage 44 is on, and the second main PMOS transistor 61 is certainly off, since it has a zero voltage drop between the source and gate terminals. Hence, the second auxiliary PMOS transistor 62 is off and the output node 70 is low, as is the word line 72. Furthermore, the output NMOS transistor 71 is on. The push NMOS transistor 80 is off, since it is equivalent to a reverse-biased diode; in fact, its drain and gate (anode) terminals are set at the same voltage $V_{CC}$, and its source terminal (cathode) is biased at $V_{PP}$.

When the word line 72 is to be selected, both the input signals IN1 and IN2 switch to high. Consequently, the output 41a of the NAND gate 41 switches to low, immediately switching off the output NMOS transistor 71 and the push NMOS transistor 80. Furthermore, the gate terminal of the second auxiliary PMOS transistor 62 switches to low (ground). Thus, the second auxiliary PMOS transistor 62 sets itself for switching on, but cannot conduct current, since the second main PMOS transistor 61 is still off. The output of the inverter 42 switches to the high logic state ($V_{CC}$), switches on the first NMOS transistor 53 of the feedback inverter stage 43, and pushes the gate terminal of the first auxiliary PMOS transistor 52 to high voltage (to $V_{CC}$). Consequently, a reduced voltage (corresponding to the difference between $V_{PP}$ and $V_{CC}$) is present between the source and gate terminals of the first auxiliary PMOS transistor 52, which starts switching off, thus limiting the current flowing through the first main PMOS transistor 51. The voltage on intermediate node 58, discharged by the first NMOS transistor 53, drops, thus starting to witch off the second NMOS transistor 63 of the driving inverter stage 44 and starting to witch on the second main PMOS transistor 61. Then, the output node 70 starts to rise, further switching off the first main PMOS transistor 51 of the feedback inverter stage 43 and enabling the intermediate node 58 to reach a potential close to ground potential. The second main transistor 61 thus reaches a fully switched on condition and pulls the output node 70 to the voltage $V_{PP}$.

The word line 72 is thus now connected to the voltage $V_{PP}$. Also in this condition, there are no components having two terminals (source and drain or source and gate) biased at different supply voltages, and thus there are no components in an intermediate state (not completely switched off or not completely switched on) or presenting undesired directly biased junctions. Consequently, under steady state conditions, the switch circuit 40 has no consumption.

When the word row 72 is to be selected, the input signals IN1 and IN2 switch to low, causing the output 41a of the NAND gate 41 to switch to high and the output of the inverter 42 to switch to low. The push NMOS transistor 80 and the output NMOS transistor 71 switch on, pulling the intermediate node 58 towards the voltage $V_{CC}$ of the first supply line 50 and the output node 70 towards ground. At the same time, the gate/source voltage drop (corresponding to the difference between the voltage $V_{PP}$ and the voltage $V_{CC}$) of the second auxiliary PMOS transistor 62 is reduced and the latter enters a current limitation condition, as does the first auxiliary PMOS transistor 52 of the feedback branch in the selection phase. In addition, the first NMOS transistor 53 of the feedback inverter stage 43 switches off, enabling rising of the intermediate node 58, switching on of the second NMOS transistor 63 of the driving inverter stage 44, and switching off of the second main PMOS transistor 61, helped by the current limitation determined by the second auxiliary PMOS transistor 62. The output node 70 then drops further, determining switching on of the first main PMOS transistor 51 and further rising of the intermediate node 58 up to the voltage $V_{PP}$. At the end of the transient determined by the feedback between the driving inverter stage 44 and the feedback inverter stage 43, the output node 70 is at a voltage equal to ground voltage, the first PMOS transistors 51 and 52 are completely switched on, and the second PMOS transistors 61, 62 of the driving inverter stage 44 are completely off. The push NMOS transistor 80 is now off again.

In the selection switching phase when the signal on the control input 41a switches to low, as explained above, switching off of the first main PMOS transistor 51 of the feedback inverter stage 43 is guaranteed and speeded up by the current throttling effect of the first auxiliary PMOS transistor 52. In addition, since the NMOS transistor 53 has larger dimensions than the NMOS transistor 63 of the driving inverter stage 44, it tends to absorb a high current rapidly and to lower the intermediate node 58 quickly to switch off the NMOS transistor 63, which, being smaller, presents less inertia. In this way, the transient has a short duration.

In the deselection switching phase described above, the switching of the output node 70 is made possible by the presence of even just one of the push NMOS transistor 80 or output NMOS transistor 71 because voltage at the intermediate node 58 raises or at the output node 70 drops. The simultaneous presence of the NMOS transistors 80 and 71 in any case increases the rapidity of switching, which is further enhanced by the auxiliary PMOS transistor 62 which, as indicated above, favors switching off of the main PMOS transistor 61, limiting the current of the latter.

The first auxiliary PMOS transistor 52 further guarantees switching from the output deselection to the output selection state, even in the presence of a high supply voltage $V_{PP}$, which renders switching off of the first main PMOS transistor 51 (which has a high voltage drop between the source and gate terminals) difficult, owing to the limitation of current in the first main PMOS transistor 51, as explained above.

The switch circuit 40 reduced the consumption during the switching phases both on account of the enhanced speed and on account of the reduction of the current flowing in the active branches during switching. In fact, during selection of the output 70, when the first main PMOS transistor 51 of the feedback inverter stage 43 is not yet switched off and the first NMOS transistor 53 starts switching on, the current flowing in he feedback inverter stage 43 is limited by the first auxiliary PMOS transistor 52, as described above. Likewise, during deselection, when the second main PMOS transistor 61 s still switched on and the output NMOS transistor 71 is already on, the current flowing in the driving inverter stage 44 is limited by the second auxiliary PMOS transistor 62, as described above.

In practice, splitting the top PMOS transistor in the driving inverter stage 44 into two separate transistors, a main one 61, and an auxiliary one 62, both controlled via signals having the same polarity but different values in the same logic state (high) and different timing, as well as splitting the top PMOS transistor in the feedback inverter stage 43 into two separate transistors, a main one 51 and an auxiliary one 52, also both controlled via signals with the same polarity but different values and different timing, makes it possible to modulate the force (current conducting capability and stability) of the two inverter stages, namely the feedback inverter stage 43 and the driving inverter stage 44, according to the operating phase of the switch circuit 40, and in particular makes it possible to have a feedback inverter stage 43 and a driving inverter stage 44 with the desired electrical characteristics during steady state operation (selection state or deselection state), as well as to reduce the force of each branch during the transients, with the aim of helping switching, as well as reducing consumption. In addition, it is possible to increase the difference between $V_{PP}$ and $V_{CC}$, keeping the switch circuit 40 operative.

In this way, even if the main PMOS transistor 61 must be made of large dimensions, and hence tends to conduct a high current during the transients, the current limitation obtained through the auxiliary PMOS transistor 62 and the shortening of the switching times described above in any case guarantee reduced consumption.

The possibility of connecting the push NMOS transistor 80 to the second supply line 54 set at $V_{PP}$, instead of to the first supply line 50 set at $V_{CC}$, is advantageous when the voltage $V_{PP}$ on the second supply line 54 may drop below the voltage $V_{CC}$ on the first supply line 50 in particular operating conditions, for example during erasing of the memory 100. In this case, in fact, the word line 72, together with the other word lines (not shown) belonging to a same memory sector, must be brought to a non-selected condition, and the output 41a of the NAND gate 41 is high (at $V_{CC}$). Consequently, with the drain terminal of the push NMOS transistor 80 connected to the first supply line 50, the push NMOS transistor 50 would be equivalent to a diode directly biased between the first supply line 50 and the intermediate node 58 and would conduct current towards the intermediate node 58 itself. In addition, it would not allow the potential on the intermediate node 58 to drop below the voltage $V_{PP}-V_{th}$, where $V_{th}$ is the voltage drop on the diode-connected push NMOS transistor 80. Instead, connecting the drain terminal of the push NMOS transistor 80 to the second supply line 54 causes this transistor to operate in the conditions previously described for $V_{PP} > V_{CC}$.

When the memory 100 enters an erasure condition via the gate terminal of the memory cells (not shown), the low level node 65 is connected to the negative supply line 75. In this way, the output 70 can be brought to a negative potential, in the same manner as for usual row decoders formed in triple well.

Figure 10:
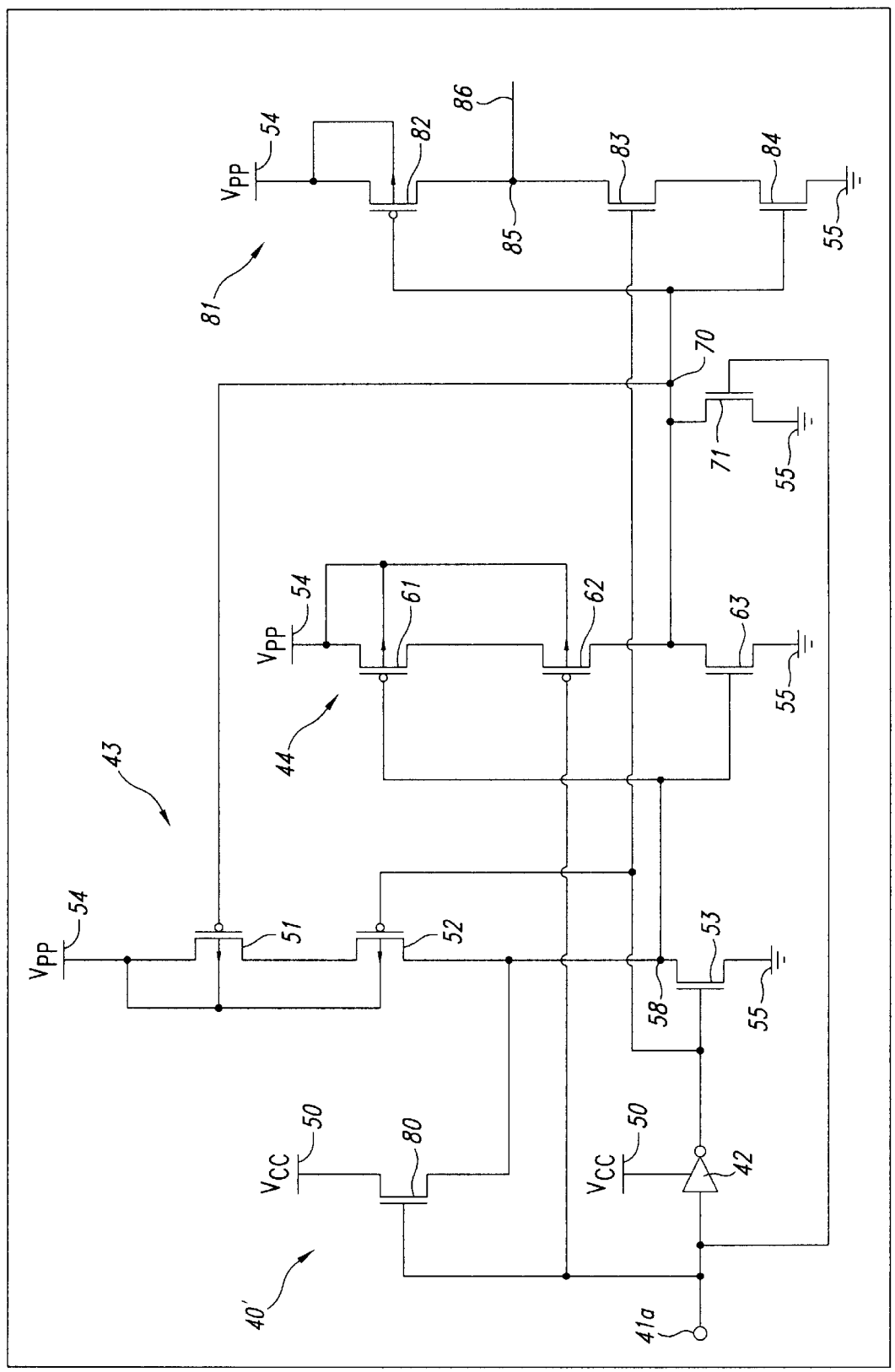
FIG. 10 shows a second embodiment of the switch circuit according to the invention.

FIG. 10 shows a different embodiment of the present switch circuit, indicated by 40', wherein the NAND gate 41 belonging to the row decoding is no longer present, and the output node 70 is connected to an output line 86 via an output inverter 81.

The switch circuit 40' of FIG. 10 is advantageously used when a higher output current capability is required, for example when a line is to be driven. For this purpose, in the example illustrated, the output inverter 81 comprises a top PMOS transistor 82, a auxiliary bottom NMOS transistor 83, and a main bottom NMOS transistor 84, connected together in series between the second supply line 54 and ground 55.

The top PMOS transistor 82 has the source and bulk terminals connected to the second supply line 54, the gate terminal connected to the output node 70, and the drain terminal connected to an output 85, which is in turn connected to an output line 86. The auxiliary bottom NMOS transistor 83 has the drain terminal connected to the output 85, the gate terminal connected to the output of the inverter 42, and the source terminal connected to the drain terminal of the main bottom NMOS transistor 84. The main bottom NMOS transistor 84 has the gate terminal connected to the output node 70 and the source terminal connected to ground 55.

For the rest, the switch circuit 40' is the same as the circuit 40 of FIG. 9, except for the fact that here the source terminals of the second NMOS transistor 63 of the driving inverter stage 44 and of the output transistor 71 are connected directly to ground 55, and the push transistor 80 here has the drain terminal connected to the first supply line 50. Alternatively, the push transistor 80 can, also in this case, be connected to the second supply line 54. In addition, the bottom NMOS transistors 83 and 84 can be formed in a triple well, if the output line 86 is to be brought to a negative voltage.

The top PMOS transistor 82 of the output inverter 81 has large dimensions, suitable for driving the output line 86 without the capability associated to the output node 85 preventing operation of the switch circuit 40', given that the output inverter 81 is external to the feedback loop comprising the driving inverter stage 44 and the feedback inverter stage 43.

The auxiliary bottom NMOS transistor 83 is controlled directly by the output signal of the inverter 42, upstream of the feedback stage comprising the feedback inverter stage 43 and the driving inverter stage 44. Consequently, the auxiliary bottom NMOS transistor 83 limits the current flowing through the output inverter 81 in the switching transient of the output 85 from the low state to the high state, in a way similar to what has been described with reference to FIG. 9 as regards the auxiliary PMOS transistors 52, 62. In a similar manner (not shown), the top PMOS transistor 82 can be split into two transistors, one of which is the main one and is connected to the output node 70, and the other is the auxiliary one connected to the control input 41a to limit the current of the output inverter 81 in the switching transient of the output 85 from the high state to the low state.

Finally, it is clear that modifications and variations may be made to the switch circuit described and illustrated herein, all of which falling within the scope of the invention, as defined in the attached claims. In particular, it is emphasized that the present switch circuit may be applied, besides of to the row decoding stage described herein, also to all the cases where it is necessary to switch a node between two different voltage levels according to a control signal which, in turn, can be switched between voltages, at least one of which is different from the voltages supplied to the node downstream. Furthermore, as shown in FIG. 10, should it not be necessary to supply a negative voltage on the output, the two position switch 76 may be omitted. Finally, the components may be replaced by other complementary components, according to the desired logic levels.

What is claimed is:

1. A switch circuit comprising:
  a first reference potential line at a first potential;
  a second reference potential line at a second potential;
  a third reference potential line at a third potential;
  a first voltage node connected, in a preset operating condition, to said third reference potential line;
  a control input receiving a control signal switchable between said first and third potentials;
  a driving inverter stage connected between said second reference potential line and said first voltage node, and having an input node and an output node;
  a feedback inverter stage connected between said second and said third reference potential lines, said feedback inverter stage comprising a first top transistor and a first bottom transistor having an intermediate node therebetween and having respective control terminals, said control terminal of said first top transistor being connected to said output node, said control terminal of said first bottom transistor being connected to said control input, and said intermediate node being connected to said input node of said driving inverter stage; and
  an activation element with a control terminal connected to said control input configured for helping a switching of said intermediate node from said third potential to said second potential, said activation element being an element distinct from said feedback inverter stage.

2. The switch circuit according to claim 1, wherein said feedback-inverter stage comprises first current capability modulating means.

3. The switch circuit according to claim 2, wherein said first current capability modulating means comprise a first current limiting element active during a switching phase of said intermediate node from said second potential to said third potential.

4. The switch circuit according to claim 3, wherein said first top transistor is of a first conductivity type, said first bottom transistor is of a second conductivity type, and in that said first current limiting element comprises a first auxiliary transistor of said first conductivity type and having a control terminal connected to said control input.

5. The switch circuit according to claim 4, wherein said driving inverter stage comprises second current capability modulating means.

6. The switch circuit according to claim 5, wherein said second current capability modulating means comprise a second current limiting element active during a switching phase of said intermediate node from said third potential to said second potential.

7. The switch circuit according to claim 6, wherein said driving inverter stage further comprises a second top transistor, and said second current limiting element comprises a second auxiliary transistor of said first conductivity type, connected between said second top transistor and said output node and having a control terminal connected to said control input.

8. The switch circuit according to claim 4, further including:

an inverter element connected between said control input and said control terminal of said first bottom transistor, and wherein said driving inverter stage comprises a second top transistor of said first conductivity type and a second bottom transistor of said second conductivity type, connected together in series and having an intermediate node forming said output node.

9. A switch circuit comprising:

a first reference potential line at a first potential;

a second reference potential line at a second potential;

a third reference potential line at a third potential;

a first voltage node connected, in a preset operating condition, to said third reference potential line;

a control input receiving a control signal switchable between said first and third potentials;

a driving inverter stage connected between said second reference potential line and said first voltage node, and having an input node and an output node;

a feedback inverter stage connected between said second and said third reference potential lines, said feedback inverter stage comprising a first top transistor and a first bottom transistor having an intermediate node therebetween and having respective control terminals, said control terminal of said first top transistor being connected to said output node, said control terminal of said first bottom transistor being connected to said control input, and said intermediate node being connected to said input node of said driving inverter stage; and an activation element helping a switching of said intermediate node from said third potential to said second potential, said activation element comprising a push transistor coupled between said first reference potential line and said intermediate node and having a control terminal connected to said control input.

10. The switch circuit according to claim 1, wherein said activation element comprises a push transistor coupled between said second reference potential line and said intermediate node and having a control terminal connected to said control input.

11. A switch circuit comprising:

a first reference potential line at a first potential;

a second reference potential line at a second potential;

a third reference potential line at a third potential;

a first voltage node connected, in a preset operating condition, to said third reference potential line;

a control input receiving a control signal switchable between said first and third potentials;

a driving inverter stage connected between said second reference potential line and said first voltage node, and having an input node and an output node;

a feedback inverter stage connected between said second and said third reference potential lines, said feedback inverter stage comprising a first top transistor and a first bottom transistor having an intermediate node therebetween and having respective control terminals, said control terminal of said first top transistor being connected to said output node, said control terminal of said first bottom transistor being connected to said control input, and said intermediate node being connected to said input node of said driving inverter stage; and an activation element helping a switching of said intermediate node from said third potential to said second potential, said activation element comprising an output transistor coupled between said output node and said first voltage node and having a control terminal connected to said control input.

12. A switch circuit comprising:

a first reference potential line at a first potential;

a second reference potential line at a second potential;

a third reference potential line at a third potential;

a first voltage node connected, in a preset operating condition, to said third reference potential line, said first voltage node being selectively connectable to said third reference potential line and to a fourth potential different from said first, second and third potentials;

a control input receiving a control signal switchable between said first and third potentials;

a driving inverter stage connected between said second reference potential line and said first voltage node, and having an input node and an output node;

a feedback inverter stage connected between said second and said third reference potential lines, said feedback inverter stage comprising a first top transistor and a first bottom transistor having an intermediate node therebetween and having respective control terminals, said control terminal of said first top transistor being connected to said output node, said control terminal of said first bottom transistor being connected to said control input, and said intermediate node being connected to said input node of said driving inverter stage; and an activation element helping a switching of said intermediate node from said third potential to said second potential.

13. A switch circuit comprising:

a first reference potential line at a first potential;

a second reference potential line at a second potential;

a third reference potential line at a third potential;

a first voltage node connected, in a preset operating condition, to said third reference potential line;

a control input receiving a control signal switchable between said first and third potentials;

a driving inverter stage connected between said second reference potential line and said first voltage node, and having an input node and an output node;

a feedback inverter stage connected between said second and said third reference potential lines, said feedback inverter stage comprising a first top transistor and a first bottom transistor having an intermediate node therebetween and having respective control terminals, said control terminal of said first top transistor being connected to said output node, said control terminal of said first bottom transistor being connected to said control input, and said intermediate node being connected to said input node of said driving inverter stage, said feedback-inverter stage comprising first current capability modulating means, and said first current capability modulating means comprising a first current limiting element active during a switching phase of said intermediate node from said second potential to said third potential, said first top transistor being of a first conductivity type, said first bottom transistor being of a second conductivity type, and said first current limiting element comprising a first auxiliary transistor of said first conductivity type and having a control terminal connected to said control input;

an activation element helping a switching of said intermediate node from said third potential to said second potential; and a final inverter stage connected between said second reference potential line and said third reference potential line and comprising a third top transistor, at least a third auxiliary transistor and a third bottom transistor, said third top transistor and said third bottom transistor having control terminals connected to said output node, and said third auxiliary transistor having a control terminal connected to said control input.

14. The switch circuit according to claim 13, wherein said third top transistor is of said first conductivity type and said third auxiliary transistor and said third bottom transistor are of said second conductivity type.

15. The switch circuit according to claim 4, wherein said transistors of said first conductivity type are PMOS transistors and said transistors of said second conductivity type are NMOS transistors.

* * * * *